Figure 1:
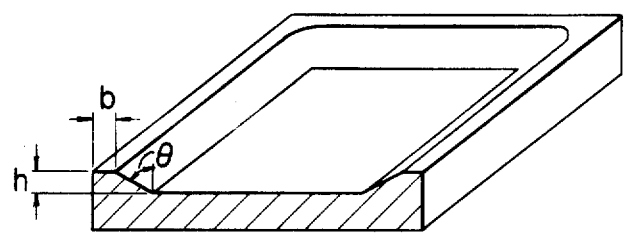

United States Patent [19]

Hoshi et al.

[11] Patent Number: 4,510,008
[45] Date of Patent: Apr. 9, 1985

[54] CONTINUOUS PRODUCTION OF COPPER-CLAD LAMINATE

[75] Inventors: Ikuo Hoshi; Masami Arai, both of Shimodate; Kiyoshi Yokochi, Tochigi; Yasuo Miyadera; Atsushi Fujioka, both of Shimodate; Takehisa Nakagawa, Yuki, all of Japan

[73] Assignee: Hitachi Chemical Company, Ltd., Tokyo, Japan

[21] Appl. No.: 433,099

[22] Filed: Oct. 6, 1982

[30] Foreign Application Priority Data

Oct. 15, 1981 [JP] Japan .................. 56-165411

[51] Int. Cl.³ .......................... B29C 19/00
[52] U.S. Cl. ...................... 156/245; 156/269; 156/283; 156/295; 156/307.7; 156/324
[58] Field of Search ............ 156/242, 245, 269, 324, 156/283, 307.1, 307.7, 295

[56] References Cited

U.S. PATENT DOCUMENTS 4,087,300  5/1978  Adler ................. 156/307.7
4,389,453  6/1983  Kitanaka et al. ....... 156/242

FOREIGN PATENT DOCUMENTS 54-135859  of 1979  Japan .
1525872   9/1978   United Kingdom .

Primary Examiner—Jay H. Woo
Assistant Examiner—Timothy W. Heitbrink
Attorney, Agent, or Firm—Antonelli, Terry & Wands

[57] ABSTRACT

Copper-clad laminates for printed wiring boards with almost no warpage can be produced continuously without using a solvent by continuously running a continuous, fibrous substrate, supplying partially and intermittently a solventless thermosetting resin mixture to the running substrate, laminating a copper foil at least one surface of the running substrate, pressure molding with heating the copper foil laminated substrate in a mold comprising a pair of flat plates at least one of which has projecting portions tapered to the center of the flat plate at the periphery thereof, taking off and cutting the molded laminate.

11 Claims, 2 Drawing Figures

CONTINUOUS PRODUCTION OF COPPER-CLAD LAMINATE

This invention relates to a process for continuously producing a copper-clad laminate for printed wiring boards.

As copper-clad laminates for printed wiring boards, there have been used those obtained by combining various fibrous substrates such as woven fabrics, nonwoven fabrics, paper-like materials made from glass fibers, organic fibers, wood pulp, and the like with various thermosetting resins such as phenolic reins, epoxy resins, polyester resins, and the like, for example, paper-phenolic resin, glass mat-polyester, glass cloth-epoxy resin, etc. These laminates have generally been produced by impregnating or coating a substrate with a varnish which is liquid at room temperature and has been diluted with a solvent, removing the solvent in a drier and the like and simulaneously proceeding the reaction to a state suitable for press molding in later stage to produce a prepreg wherein the reaction is proceeded to so-called B stage, cutting the prepreg in desired dimensions, piling copper foils on the surfaces of the resulting prepreg, and pressure molding with heating in multi-stage parallel heating plates while holding the prepreg between flat panels. According to such a conventional process, there can be obtained a voidless substrate having good impregnating properties by treating the substrate with a varnish having a low viscosity for impregnation prior to the press molding and there can also be obtained a laminate having smooth surfaces without warpage satisfying important properties as wiring boards by holding the prepreg between the flat panels during the molding in paralled heating plates. But such a process has disadvantages in that a large amount of solvent is necessary for impregnating the substrate, much energy is necessary for drying, recovering of the solvent is difficult and most of the solvent is lost. Flying out of the solvent also causes a problem of air pollution. Further, since individual steps such as impregnation, piling of prepreg, press molding, cutting, etc., are conducted separately without employing a continuous process, much man-power and man-hour are required, which results in increasing production cost.

In order to solve such problems, there have been proposed various processes such as a process for producing a laminate by using a solventless resin, a process for continuously producing a laminate for printed wiring boards using a solventless resin, etc. For example, there are proposed a so-called SMC process wherein glass chopped strands are impregnated with an unsaturated polyester resin, the resulting resin impregnated glass chopped strands (a sheet-like molding material (SMC)) previously increasing viscosity chemically and having a copper foil on the surface thereof are supplied in a mold, followed by pressing with heating; a pultrusion process for producing a laminate comprising passing a substrate in an unsaturated polyester resin bath for impregnation with the resin, supplying the substrate together with a copper foil into a heating die and conducting continuous molding (Insulation Circuit, November, page 28, 1977); a process for producing a laminate comprising leading a plurality of substrates into a solventless resin bath for impregnation with a desired amount of the resin and molding by calendering or heating roller press (British Pat. No. 1525872); a process for producing a laminate comprising forming a mixture of solventless resin and a filler into a sheet-like material by an extruder, conducting the reaction to the B stage, laminating a prepreg obtained by a conventional process on the sheetlike core material and a copper foil on the prepreg, and molding with, e.g., a belting press (Japanese Patent Appln Kokai (Laid-Open) No. 135859/79); etc. But, according to the SMC process, local orientation of the glass fiber readily takes place with the flow of materials during the press molding, which results in making the warpage greater. According to the pultrusion process and the roller press process, since a sufficient pressure hardly be applied during the molding, removal of voids is difficult, and it is also difficult to produce a flat laminate having no warpage since the substrate material is strongly pulled during the holding of flowability of the resin so as to disturb the arrangement of fiber material. According to the extrusion process, good properties can hardly be obtained without providing the prepreg prepared separately. In these processes, solventless resins are used, but since these resins are previously impregnated into substrates uniformly, followed by molding by using molds, rollers, heating plates, etc., the above-mentioned problems are still retained.

On the other hand, according to a conventional FRP molding process (FRP=fiber reinforced plastics), a product is produced by placing a fibrous substrate without impregnation with a resin in a mold, supplying a liquid solventless resin to the mold and pressing with heating so as to conduct the impregnation and molding at the same time in the mold. Such a process is employed in, for example, matched die molding, cold pressing, etc. According to this process, the impregnation of substrate with a resin previously is omitted to give a simplified process. But even if applying such a FRP molding process to the production of copper-clad laminates for printed wiring boards required to have high properties, there can hardly be obtained laminates having no voids and little warpage. Further, according to the matched die molding process, there are other problems in that the continuous production is impossible since individual products are molded batch wise one after one by cutting and removing superfluous portions of the substrate by share edge portion of the mold at the end thereof, in the case of covering the surface with a copper foil molten resin liberated from the share edge portion flows into the portion between the copper foil and the mold to lose properties suitable as copper-clad laminate for printed wiring boards, and the like.

It is an object of this invention to provide a process for continuously producing a copper-clad laminate for printed wiring boards having almost no warpage using a solventless thermosetting resin with good impregnation of the resin.

This invention provides a process for continuously producing a copper-clad laminate for printed wiring boards which comprises running a continuous, fibrous substrate, supplying partially and intermittently a solventless thermosetting resin mixture to the running substrate, laminating a copper foil at least one surface of the running substrate, pressure molding with heating the copper foil laminated substrate in a mold comprising a pair of flat plates at least one of which has projecting portions tapered to the center of the flat plate at the periphery of the flat plate so as not to cut the copper foil and to pinch the copper foil and the substrate, taking off the molded laminate from the mold while opening the mold, and cutting the molded laminate.

Figure 2:
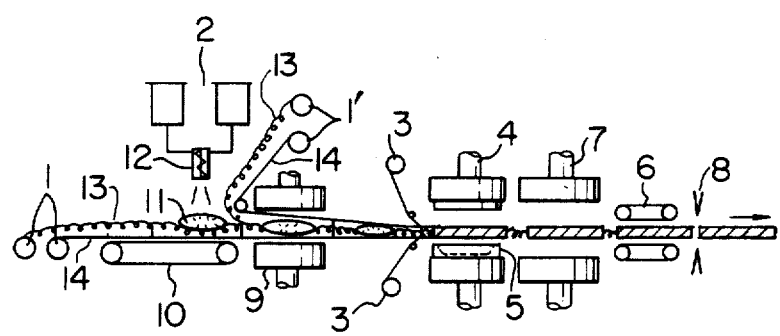

In the attached drawings, FIG. 1 is a partly cross-sectional perspective view of a mold used in this invention, and FIG. 2 is a schematic flow sheet explaining the process of this invention.

One of the important features of this invention is to use the mold having a special structure as shown in FIG. 1.

According to the above-mentioned FRP process such as matched die process, cold pressing process, etc., there are used molds comprising a positive mold and a negative mold which are matched at the periphery portions thereof with a little clearance. Superfluous substrate pressed out of the mold is cut at the share edge portion and by the flow resistance of the resin at the clearance portion the inner pressure is applied to the product in the mold. When such a mold having a matched structure is used for producing copper-clad laminates for printed wiring boards, copper foils and substrates are cut at the share edge portion, so that the molten resin flowed from the cut portion is led to the surface of the copper foil to form a thin cured film of resin on the copper foil, which results in losing functions as printed wiring boards and making a continuous molding impossible because of impossibility of transporting a molded laminate to the next procedure. In order to maintain a sufficient inner pressure, the clearance at the share edge portion should be as small as about 0.1 to 0.2 mm, but in order to improve the impregnation of the resin and to remove voids so as to satisfy the enhanced requirements for printed wiring boards, the clearance should become smaller; this is practically very difficult.

In order to solve such a problem, the present inventors have devised a special mold which can hold a sufficient inner pressure to remove voids without causing cutting of copper foil and substrate and accomplished a continuous process for producing laminates of this invention. That is, the mold comprising a positive part and negative part one having a matched structure is not used, but there is used the mold comprising a pair of flat plates at least one of which has projecting portions tapered to the center of the flat plate at the periphery thereof so as not to cut copper foil and substrate at the projecting portion and so as to pinch the copper foil and the substrate strongly for subjecting to pressure molding with heating. This is one of the features of this invention. By the use of the pair of flat plates at least one of which has tapered projecting portions, the copper foil and the substrate are clamped strongly by the projecting portion during pressure molding with heating, but by the clamped portion oozing out of molten resin is prevented and the inner pressure can be maintained. The inner pressure to be maintained depends on the degree of clamping of the substrate and in order to hold a substrate enough to maintain a sufficient inner pressure so as to remove voids without cutting the copper foil and the substrate, the use of a mold having projecting portions tapered to the center thereof is essential.

The form of projecting portion is explained referring to FIG. 1. The form of projecting portion can be determined by the height (h), width (b) and tapered angle ($\theta$). The degree of clamping of the substrate depends on the press pressure applied to the projecting portion and is determined by a ratio of projecting portion area to the plate area, and the width (b) can be optionally selected depending on the size of the plate. The height (h) of the projecting portion can be determined by reducing the thickness of the substrate at the clamped portion by the projecting portion from the desired thickness of the substrate. The tapered angle ($\theta$) is preferably 55° or more irrespective of the height and the width. If the tapered angle ($\theta$) is zero, i.e., the edge being in right angle, the copper foil and succesively the substrate may be cut before sufficient clamping is attained. When the tapered angle is 55° or more, sufficient clamping so as to obtain a sufficient inner pressure becomes possible without cutting. But too large tapered angle makes the yield of laminates lower since substrate on the tapered portions is removed from the final products. The tapering is not limited to a linear slope as shown in FIG. 1 and a slope with a slight curvature or a step-like slope may be used. In such a case, an average angle corresponding to the $\theta$ is preferably 55° or more. In FIG. 1, a lower mold having the projecting portion is shown, but the projecting portion may be formed on the upper mold or both of the lower and upper molds so as to face each other. When the projecting portions are formed on both of the lower and upper molds so as to face each other, the cost for making such molds may be increased but the yield of final products can be increased by shortening the portion corresponding to the tapered portion of the molds, said portion being taken off from the final products. The portion of the width (b) may be flat or slightly curved plane.

Another important feature of this invention is that the solventless thermosetting resin is supplied to the running fibrous substrate partially and intermittently. The term "partially" means that the resin is supplied to the running fibrous substrate not on the whole substrate thereof but only "partially" on the portion corresponding to the central portion when that portion is placed in the special mold in an amount sufficient for impregnating the substrate in the mold with the resin. The partially supplied resin on the central portion is molten in the mold during the pressure molding with heating with a low viscosity and flows towards the periphery of the mold by pressing so as to permeate into the whole body, while at the same time by the preventing effect at the projecting portion from oozing out of the resin the inner pressure is finally increased so as to attain the sufficient impregnation of the substrate with the resin. When the resin is supplied to the substrate wholely, not partially, the flow of the resin is reduced and removal of bubbles from the substrate becomes insufficient. Further, in the continuous process, the resin placed in the position near the mold and to be molded in the next time is cured by the heat from the mold during the pressure molding with heating and since said cured portion cannot be used for molding, the yield is thus undesirably lowered.

Further, the resin should be supplied to the running fibrous substrate "intermittently". The term "intermittently" means that the resin should be supplied to the running substrate with a time interval so as to make the continuous operation of pressure molding using the special mold possible.

By supplying the resin to the running substrate partially and intermittently, the continuous process according to this invention becomes possible. More concretely, it is preferable to supply the resin to a central portion of the running substrate so that said portion takes a place at a central portion in the mold when placed in the mold, more preferably about 30 mm inside of the projecting portion of the mold.

As the fibrous substrate, there can be used fiber-reinforced substrates, e.g., woven fabrics such as cloth, nonwoven fabrics such as swirl mats, paper-like materials, these materials mentioned above being made from glass fibers, woven fabrics, nonwoven fabrics and paper-like materials made from organic fibers, wood pulp, etc.

As the solventless thermosetting resin, there can be used thermosetting resins containing substantially no solvent such as epoxy resins, unsaturated polyester resins, phenolic resins, and the like.

Among the solventless thermosetting resins, those except for resins such as unsaturated polyesters containing crosslinkable monomer (these being liquid) are sometimes solid or semi-solid with high viscosities at normal temperatures. In such a case, the resin can be supplied in molten state with low viscosity with heating previously to the running substrate together with one or more curing agents, fillers and other additives in admixture with the resin.

It is preferable in this invention to use a thermosetting resin mixture containing one or more curing agents, fillers and the like additives which mixture can give a melt viscosity of 0.1 to 50 poises at the mold molding temperature. If the viscosity is lower than 0.1 poise, the inner pressure does not raise sufficiently, which results in insufficient impregnation causing many voids in the substrate. This is because even if the special mold having the tapered projecting portion is used and clamped with the projecting portion, it is impossible to make the clearance between the substrate zero by the projecting portion. Thus, the resin may be oozed out from such clearances to give undesirable effects. Bulky substrates such as nonwoven fabrics and paper-like materials can easily raise the inner pressure compared with woven fabrics such as cloth, so that the resin with a lower viscosity can suitably be used for such bulky fibrous substrates. On the other hand, if the viscosity is higher than 50 poises, the inner pressure may easily be raised but impregnation into the substrate may be lowered due to higher viscosity. Further, during the pressure molding with heating, fibrous materials flow together with the flow of the molten resin, which results in bringing about inclination and local orientation of the fibrous materials and greater warpage of the produced laminates. Considering the flow of the fibrous materials, the use of woven fabrics is preferable and the use of nonwoven fabrics and paper-like materials with long fibers is advantageous due to stronger resistance to the flow than those with short fibers.

These substrates are used in continuous form alone or as a mixture of two or more of them. It is also possible and preferable to use a woven fabric such as glass cloth as a surface material and a nonwoven fabric such as a swirl mat or paper-like material as an inner core layer. By the reasons mentioned above, the use of the nonwoven fabric or paper-like material as the core layer is preferable, since such a material is good in impregnation properties due to giving a higher inner pressure under the same clamping pressure but such a material is disadvantageous due to being readily flowable. On the other hand, the use of the woven fabric as the surface layer is preferable, since the woven fabric is more resistant to the flow of the molten resin and disturbance of the substrate at the surface portion may be prevented. Thus the combined use of the woven fabric and the nonwoven fabric or paper-like material with the above-mentioned structure makes it possible to produce a copper-clad laminate with good impregnation without warpage, the woven fabric surface layer giving a larger strength such as flexual strength to the resulting laminate.

Further, the solventless thermosetting resin mixture may be supplied to the substrate from the surface thereof, but it is preferable to supply the resin mixture to the substrate at the central portion to the direction of the thickness of the substrate.

The process for continuously producing a copper-clad laminate for printed wiring boards is explained in detail referring to FIG. 2. The solventless thermosetting resin 11 is supplied from a resin supplying means 12 after mixing with one or more curing agents and, if required fillers and the like additives in a resin supplying tank 2 between running fibrous substrates 1 and 1' comprising a core layer 13 and a surface layer 14 partially and intermittently. Numeral 10 denotes a conveyer for carrying the continuous substrate. The substrate supplied with the resin on the central portion is piled with copper foils 3 on both sides and led to a press 4 by which the copper-clad substrate is pressure molded with heating using a mold 5 having projecting portions. In such a case, it is preferable to preheat the copper foil prior to piling at a temperature of ±60° C. of the molding temperature, more preferably ±30° C. of the molding temperature in order to prevent the wrinkle of the product. After completion of the molding, the mold is open and the molded product is taken off by a take-off device 6 before closing of the mold 5. By this take-off operation the portion of the substrate to be molded in the next place is led into the mold. If necessary, the molded substrate may be cooled by a cooling press 7 for preventing warpage before the handling with the take-off device. Then the resulting substrate is cut by a cutter 8 to give the desired copper-clad laminate for printed circuit boards. In FIG. 2, the substrates are fed from the two places and the resin is supplied to the center of the substrates, but a plurality of substrates may be supplied from one place and the resin may be supplied to the plurality of substrates on the surface thereof.

In order to prevent the reaction and increasing of the viscosity of the molten resin before leading the substrate to the press 4, when the resin is solid at room temperature and necessary to be mixed with the catalyst and the like with heating, the sutstrate may be cooled by a cooling device 9. The cooling after the molding is effective for preventing the warpage but said cooling may be omitted if required. As mentioned above, it is important to supply the resin partially to the substrate so as to make the resin supplied portion center of the mold when placed in the mold. By such an operation, the resin on the substrate portion to be molded in the next place can be maintained on the substrate without contacting with the heated mold for pressure molding.

This invention is illustrated by way of the following Examples, in which all parts are by weight unless otherwise specified.

EXAMPLE 1

Using a continuous apparatus as shown in FIG. 2, copper-clad laminates were produced continuously. A solventless epoxy resin which is solid at room temperature (Araldite 8011, a trade name, mfd. by Ciba Ltd.) was melted at 110° C. in a heating vessel 2. In another vessel 2, a mixture of an acid anhydride curing agent (methyltetrahydrophthalic anhydride, HN-2200, a trade name, mfd. by Hitachi Chemical Co., Ltd.) and a curing accelerator (benzyldimethylamine) were placed in liquid state at room temperature. From the two vessels, the contents were passed under pressure to a static mixer 12 so as to mix 100 parts of the resin, 33 parts of the curing agent and 1.0 part of the accelerator. While sufficiently mixing, the resin mixture was supplied from the static mixer to a running substrate on a belt conveyer, said substrate comprising glass cloth with 520 mm wide (210 g/m$^2$) as a surface layer 14 and a swirl mat of 520 mm wide (450 g/m$^2$) as a core layer 13 partially and intermittently. That is, the resin mixture was placed with a distance of about 200 mm along the running direction in a total amount of 400 g per area of about 400 mm square. Then the same substrate as mentioned above, i.e., that comprising a swirl mat as a core layer and glass cloth as a surface layer was laminated on the resin placed substrate as shown in FIG. 2, followed by cooling with a water-cooled press 9 with a slight pressure of contact pressure. On the other hand, copper foils with 35 μm thick preheated at 170° C. were piled on the both surfaces of the substrate and the resulting substrate was transported by a takeoff device 6 so that the resin supplied portion was placed in the center of the mold 5 heated at 170° C. Subsequently the mold was closed in 30 seconds and pressure molded for 3 minutes under a final pressure of 50 kg/cm$^2$. The upper mold was a flat plate of 510 mm square and the lower mold was a flat plate of 510 mm square having at the periphery thereof a projecting portion with a height (h) of 1.1 mm, a width (b) of 3 mm and a tapered angle (θ) of 70°. The melt viscosity of the resin mixture at 170° C. was 3 poises. After completion of the molding, the mold was open and the molded portion of the substrate was moved 510 mm by the take-off device 6, followed by cutting by a cutter 8 to give a copper-clad laminate of 500 mm square. By repeating this operation, copper-clad laminates with little warpage and no voids were produced continuously.

Properties of the produced copper-clad laminates are shown in Table 1.

TABLE 1

| Items | Performance |
|---|---|
| Thickness | 1.6 ± 0.05 mm |
| Warpage | 1.5 mm/500 mm or less |
| Voids | None |
| Peeling strength of copper foil | 2.0 kg/cm |
| Soldering heat resistance (260° C.) | 180 sec or more |
| Flexural strength | 35 kg/mm$^2$ |
| Insulation resistance (normal state) | 4 × 10$^{15}$ ohms |
| Dielectric constant | 4.6 |
| Dielectric loss tangent | 0.016 |
| Surface roughness | 3 μm |

Note
Voids: After removing the copper foil from the product by etching, the resulting surface was observed with a microscope.
Surface roughness: Average height measured by a surface roughness meter.
Other items: Measured according to JIS C-6481.

EXAMPLE 2

Copper-clad laminates were produced in the manner as shown in FIG. 2.

A liquid resin mixture was prepared by mixing at 50° C. 100 parts of an epoxy modified unsaturated polyester resin (UPE-10, a trade name, mfd. by Hitachi Chemical Co., Ltd.), 50 parts of hydrated alumina (H-40, a trade name, mfd. by Showa Keikinzoku K.K.) as a filler, and 0.5 part of dicumyl peroxide as a curing agent.

The resin mixture was supplied to a running substrate with a distance of 100 mm along the running direction of the substrate in an amount of 470 g as a total per area of 450 mm square, said substrate comrpising glass cloth as a surface layer with 520 mm wide (210 g/m$^2$) and glass paper as a core layer with 520 mm wide (300 g/m$^2$). Then, the same substrate as mentioned above comprising glass cloth and glass paper was piled on the resin placed substrate as shown in FIG. 2, followed by pilling with copper foils with 35 μm thick preheated at 170° C. on both surfaces (by omitting the cooling procedure). Then, the substrate was pressure molded in the mold in the same manner as described in Example 1, taken off and cut to give a copper-clad laminate of 500 mm square. The melt viscosity of the resin mixture at 170° C. was 10 poises.

Properties of the produced copper-clad laminates are shown in Table 2.

TABLE 2

| Items | Performance |
|---|---|
| Thickness | 1.6 ± 0.05 mm |
| Warpage | 1.5 mm/500 mm or less |
| Voids | None |
| Peeling strength of copper foil | 1.7 kg/cm |
| Soldering heat resistance (260° C.) | 180 sec |
| Flexural strength | 33 kg/mm$^2$ |
| Insulation resistance (normal state) | 5 × 10$^{14}$ ohms |
| Dielectric constant | 4.8 |
| Dielectric loss tangent | 0.017 |
| Surface roughness | 2–3 μm |

EXAMPLE 3

The process of Example 1 was repeated except for using as substrate only a swirl mat having a basis weight of 600 g/m$^2$ without using a surface layer of glass cloth and changing the tapered angle (θ) to 60° in place of 70°. The resulting copper-clad laminates were slightly inferior to those obtained in Example 1 in warpage, surface roughness and flexural strength, but the impregnation properties were good.

Properties of the produced copper-clad laminates are shown in Table 3.

TABLE 3

| Items | Performance |
|---|---|
| Thickness | 1.6 ± 0.1 mm |
| Warpage | 3 mm/500 mm or less |
| Voids | None |
| Peeling strength of copper foil | 2.0 kg/cm |
| Soldering heat resistance (260° C.) | 180 sec or more |
| Flexural strength | 25 kg/mm$^2$ |
| Insulation resistance (normal state) | 3 × 10$^{15}$ ohms |
| Surface roughness | 4–5 μm |

As explained above, since it is not necessary to impregnate the fibrous substrate with a resin varnish previously according to the process of this invention, it is not necessary to use a large amount of solvent without recovering, and it is not necessary to use the energy for drying to remove the solvent, which results in giving great effects on saving the materials and the energy.

Further, since not only an unexpensive substrate such as a nonwoven fabric or the like but also many combinations of materials can be used as substrate, various demands for substrates can easily be satisfied. In addition, since the procedures can be carried out continuously, man-power can be reduced greatly to lower the working cost remarkably.

What is claimed is:

1. A process for continuously producing a copper-clad laminate for printed wiring boards which comprises running a continuous, fibrous substrate, supplying partially and intermittently a solventless thermosetting resin mixture to a central portion of at least one surface of the running substrate, laminating a copper foil to the at least one surface of the running substrate on which the thermosetting resin mixture is supplied, pressure molding with heating the copper foil laminated substrate in a mold comprising a pair of flat plates at least one of which has projecting portions tapered to the center of the flat plate at the periphery of the flat plate so as not to cut the copper foil and to pinch the copper foil and the substrate, taking off the molded laminate from the mold while opening the mold, and cutting the molded laminate.

2. A process according to claim 1, wherein the fibrous substrate comprises a glass fiber woven fabric as a surface layer and glass fiber nonwoven fabric or paper-like material as a core layer.

3. A process according to claim 1, wherein the solventless thermosetting resin mixture is supplied to the substrate at the center portion along the thickness direction of the fibrous substrate.

4. A process according to claim 1, wherein the solventless thermosetting resin mixture is supplied to the fibrous substrate partially so as to place the resin mixture 30 mm or more inside from the projecting portions of the mold when placed in the mold.

5. A process according to claim 1, wherein the melt viscosity of the solventless thermosetting resin mixture at the mold temperature is 0.1 to 50 poises.

6. A process according to claim 1, wherein the copper foil is preheated prior to the lamination on the surface of the substrate.

7. A process according to claim 1, wherein a cooling step is provided prior to the pressure molding step.

8. A process according to claim 1, wherein the mold has tapered projecting portions with a tapered angle of 55° or more.

9. A process for continuously producing a copper-clad laminate for printed wiring boards which comprises:

moving a continuous length of a fibrous substrate along a predetermined path;

applying a solventless thermosetting resin mixture intermittently to central portions of the substrate;

laminating a continuous copper foil to at least one side of the continuous substrate on which said solventless thermosetting resin mixture has been applied;

applying heat and pressure with a mold to a selected portion of the copper foil laminated substrate that surrounds a central portion to which the solventless thermosetting resin has been applied to cause the thermosetting resin to spread outwardly and to impregnate the selected portion without the formation of voids, said mold comprising two flat plates at least one of the flat plates having projecting portions tapered to the center of the flat plate at the periphery thereof to avoid cutting the copper foil and to clamp the copper foil and substrate between contacting surfaces of the two flat plates;

removing the resulting molded copper-clad laminate from the mold; and cutting the molded laminate away from the continuous substrate and the at least one continuous copper foil.

10. A process according to claim 9, wherein the melt viscosity of the solventless thermosetting resin mixture at the temperature of the mold is 0.1 to 50 poises.

11. A process according to claim 9, wherein the two flat plates have projecting portions at peripheral areas which clamp the periphery of the selected portion whereby oozing out of molded resin is prevented and the pressure within the mold can be maintained.

* * * * *